US009472745B2

(12) United States Patent
Liu et al.

(10) Patent No.: US 9,472,745 B2
(45) Date of Patent: Oct. 18, 2016

(54) CVD NANOCRYSTALLINE SILICON AS THERMOELECTRIC MATERIAL

(71) Applicant: The United States of America, as represented by the Secretary of the Navy, Washington, DC (US)

(72) Inventors: Xiao Liu, Fairfax, VA (US); Thomas H. Metcalf, Washington, DC (US); Daniel R. Queen, Silver Spring, MD (US); Battogtokh Jugdersuren, Arlington, VA (US); Qi Wang, Littleton, CO (US); William Nemeth, Wheat Ridge, CO (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/047,671

(22) Filed: Feb. 19, 2016

(65) Prior Publication Data
US 2016/0247997 A1    Aug. 25, 2016

Related U.S. Application Data

(60) Provisional application No. 62/118,483, filed on Feb. 20, 2015.

(51) Int. Cl.
*H01L 35/34*    (2006.01)
*H01L 35/22*    (2006.01)

(52) U.S. Cl.
CPC ............... *H01L 35/34* (2013.01); *H01L 35/22* (2013.01)

(58) Field of Classification Search
None
See application file for complete search history.

(56) References Cited

U.S. PATENT DOCUMENTS

| | | | |
|---|---|---|---|
| 7,255,846 B2 | 8/2007 | Ren et al. | |
| 7,465,871 B2 | 12/2008 | Chen et al. | |
| 8,512,667 B2 | 8/2013 | Yang et al. | |
| 2008/0202575 A1 | 8/2008 | Ren et al. | |
| 2010/0167461 A1* | 7/2010 | Rana | H01L 31/0745 438/97 |
| 2011/0195185 A1 | 8/2011 | Bisquert et al. | |

(Continued)

OTHER PUBLICATIONS

Guozuen Yue, Jing Lin, Qi Wang, and Daxing Ha, "Structure and Optoelectronic Properties as a Function of Hydrogen Dilution of Micro-Crystalline Silicon Films Prepared by Hot Wire Chemical Vapor Deposition," Mat. Res. Soc. Symp. Proc. (1999) vol. 557, pp. 525-530.

(Continued)

*Primary Examiner* — Seahvosh Nikmanesh
(74) *Attorney, Agent, or Firm* — US Naval Research Laboratory; Joslyn Barritt

(57) ABSTRACT

A process for forming a doped nc-Si thin film thermoelectric material. A nc-Si thin film is slowly deposited on a substrate, either by hot-wire CVD (HWCVD) with a controlled $H_2:SiH_4$ ratio R=6-10 or by plasma-enhanced (PECVD) with a controlled R=80-100, followed by ion implantation of an n- or p-type dopant and a final annealing step to activate the implanted dopants and to remove amorphous regions. A doped nc-Si thin film thermoelectric material so formed has both a controllable grain size of from a few tens of nm to 3 nm and a controllable dopant distribution and thus can be configured to provide a thermoelectric material having predetermined desired thermal and/or electrical properties. A final annealing step is used to activate the dopants and remove any residual amorphous regions.

7 Claims, 9 Drawing Sheets

"Designed" structure of CVD nc-Si

(56) References Cited

U.S. PATENT DOCUMENTS

2012/0121495 A1     5/2012    Yang et al.
2014/0227825 A1*   8/2014    Chen .................... H01L 31/077
                                                          438/87

OTHER PUBLICATIONS

D.L. Williamson, "Medium-Range Order in a-Si:H Below and Above the Onset of Microcrystallinity," Mat. Res. Soc. Symp. Proc. (1999) vol. 557, pp. 251-261.

P. Alpuim et al, "Electronic and structural properties of doped amorphous and nanocrystalline silicon deposited at low substrate temperatures by radio-frequency plasma-enhanced chemical vapor deposition," Journal of Vacuum Science & Technology A 21, 1048-1054 (2003).

Search Report and Written Opinion mailed May 24, 2016 in corresponding International Application No. PCT/US2016/018570.

A. Majumdar, "Thermoelectricity in Semiconductor Nanostructures," Science 2004, 303, 777-778.

G. J. Snyder et al., "Complex thermoelectric materials," Nature Materials 7, 105-114 (2008).

T. C. Harman et al., "Quantum Dot Superlattice Thermoelectric Materials and devices," Science 297, 2229 (2002).

W. Kim et al. "Reducing Thermal Conductivity of Crystalline Solids at High Temperature Using Embedded Nanostructures," Nano Lett. 8, 2097 (2008).

S. K. Bux et al., "Nanostructured Bulk Silicon as an Effective Thermoelectric Material," Adv. Funct. Mater. 2009, 19, 2445-2452.

W. Liu et al., "Recent advances in thermoelectric nanocomposites," Nano Energy (2012) 1, 42-56.

D. J. Voneshen et al., "Suppression of thermal conductivity by rattling modes in thermoelectric sodium cobaltate," Nature Materials, vol. 12 (Nov. 2013), pp. 1028-1032.

M. Takashiri et al., "Effect of grain size on thermoelectric properties of n-type nanocrystalline bismuth-telluride based thin films," J. Appl. Phys. 104, 084302 (2008).

X.W. Wang et al., "Enhanced thermoelectric figure of merit in nanostructured n-type silicon germanium bulk alloy," Appl. Phys. Lett. 93, 193121 (2008).

G. Joshi et al., "Enhanced Thermoelectric Figure-of-Merit in Nanostructured p-type Silicon Germanium Bulk Alloys," Nano Letters 2008, vol. 8, No. 12, 4670-4674.

L. D. Hicks et al., "Effect of quantum-well structures on the thermoelectric figure of merit," Phys. Rev. B 47, 12727-12731, 1993.

L. D. Hicks et al., "Thermoelectric figure of merit of a one-dimensional conductor," Phys. Rev. B 47, 16631-16634 (1993).

R. Basu et al., "Improved thermoelectric performance of hot pressed nanostructured n-type SiGe bulk alloys," J. Mater. Chem. A, 2014, 2, 6922-6930.

R. Venkatasubramanian et al., "Thin-film thermoelectric devices with high room-temperature figures of merit," Nature 413, 597 (2001).

K. Biswas et al., "High-performance bulk thermoelectrics with all-scale hierarchical architectures," Nature 489, 414-418 (2012).

M. Takashiri et al., "Transport properties of polycrystalline Si0.8Ge0.2 thin films for micro power generators," Proceedings ICT'03. 22nd International Conference on Thermoelectrics (IEEE Cat. No. 03TH8726), pp. 395-398 (2003).

T. Claudio et al. "Nanocrystalline silicon: lattice dynamics and enhanced thermoelectric properties," Phys. Chem. Chem. Phys. 2014, 16, 25701-25709.

M. Takashiri et al., "Structure and thermoelectric properties of boron doped nanocrystalline Si0.8Ge0.2 thin film," J. Appl. Phys. 100, 054315 (2006).

G. Yue et al., "Structure and Optoelectronic Properties as a Function of Hydrogen Dilution of Micro-Crystalline Silicon Films Prepared by Hot Wire Chemical Vapor Deposition," Mater. Res. Soc. Symp. Proc. 557, 525-530 (1999).

D. L. Williamson, "Medium-Range Order in a-Si:H Below and Above the Onset of Microcrystallinity," Mater. Res. Soc. Symp. Proc. 557, 251-256 (1999).

M. Kondo et al., "High rate growth of microcrystalline silicon at low Temperatures," Journal of Non-Crystalline Solids 266-269 (2000) 84-89.

Y. Mai et.al., "Microcrystalline silicon solar cells deposited at high rates", J. Appl. Phys., 97, 114913 (2005).

B. L. Zink et al., "Thermal Conductivity and Specific Heat of Thin Film Amorphous Silicon," Phys. Rev. Lett. 96, 055902 (2006).

* cited by examiner

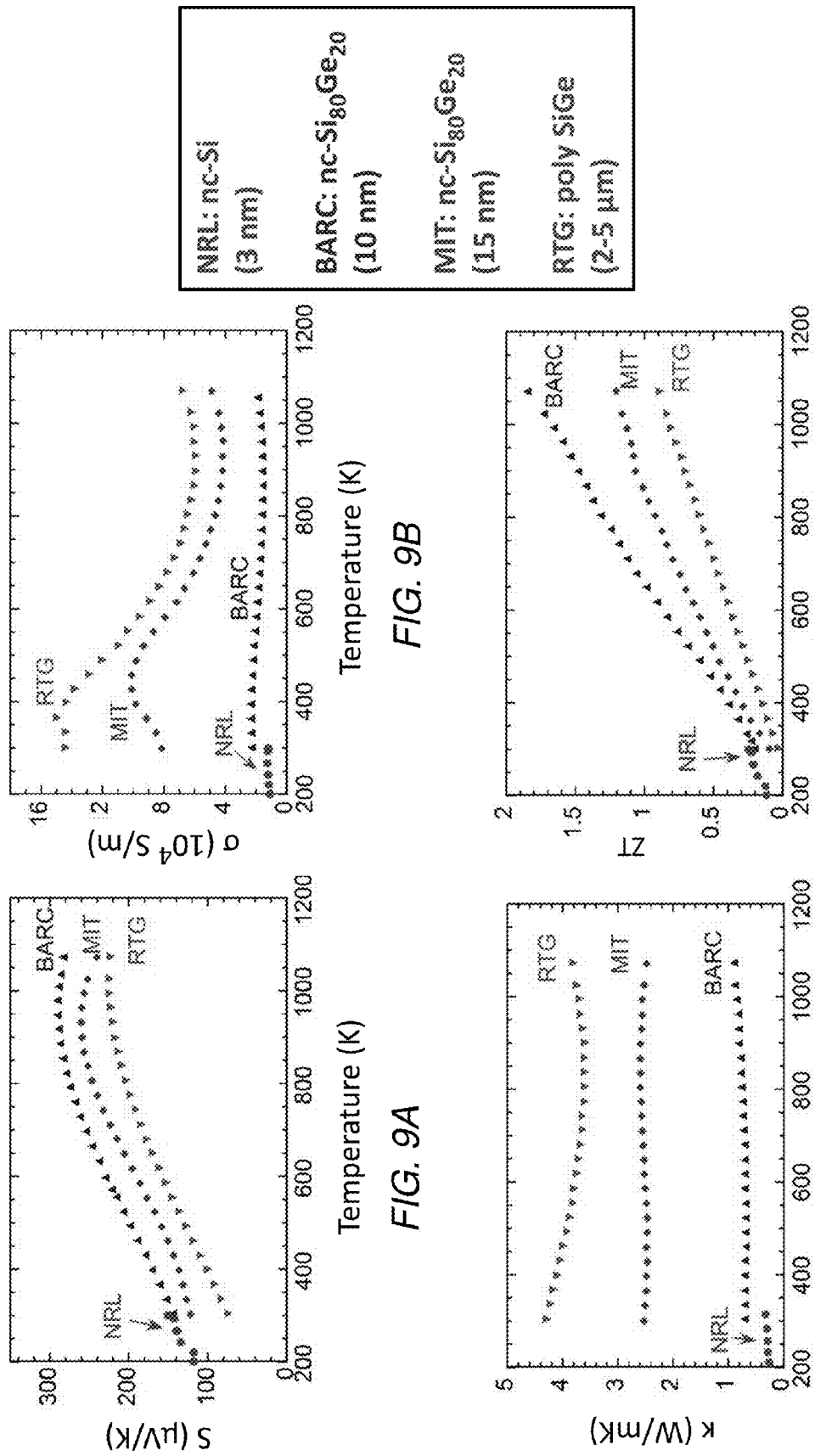

CVD NANOCRYSTALLINE SILICON AS THERMOELECTRIC MATERIAL

CROSS-REFERENCE

This Application is a nonprovisional of, and claims the benefit of priority under 35 U.S.C. §119 based on, U.S. Provisional Application No. 62/118,483 filed on Feb. 20, 2015. The Provisional Application and all references cited herein are hereby incorporated by reference into the present disclosure in their entirety.

TECHNICAL FIELD

The present disclosure relates to thermoelectric materials, particularly to nanocrystalline silicon suitable for use as a thermoelectric material and methods for making the same.

BACKGROUND

Thermoelectric materials convert a temperature gradient into electricity and vice versa.

They are of considerable current interest for solid state power generation from heat and refrigeration from electricity without moving parts. While all semiconducting materials have a non-zero thermoelectric effect, in most materials it is too small to be useful.

The thermoelectric figure of merit $$ZT = \frac{S^2 \sigma}{\kappa} T$$

measures the thermoelectric efficiency of a material, where S is the Seebeck coefficient reflecting the thermoelectric power of the material, $\sigma$ is the material's electrical conductivity, $\kappa$ is its thermal conductivity, and T is the absolute temperature. These parameters depend on both the electronic and the phonon transport properties of the material, with the ideal thermoelectric material having high S, high $\sigma$, and low $\kappa$.

The enormous potential of high-efficiency thermoelectric devices has led to decades of work aimed at optimizing these parameters in semiconductor and semimetal compounds in an attempt to increase ZT.

Unfortunately, the parameters of ZT are interdependent, such that changing one alters the others. As a result, it is often found that the resulting changes in ZT are minimal. See A. Majumdar, "Thermoelectricity in Semiconductor Nanostructures," Science 2004, 303, 777-778.

For example, the Seebeck coefficient S is a fundamental material property related to carrier effective mass and is typically difficult to engineer. In general, single-carrier materials (e.g. n- or p-type doped semiconductors) can achieve S in a suitable magnitude. In addition, in semiconductors, electrical conductivity $\sigma$ can be increased by increasing the doping level. Thus, highly doped semiconductors can often satisfy the first two requirements for obtaining a high ZT, i.e., having a large Seebeck coefficient and high electrical conductivity. However, too much doping will drive a semiconductor into a metallic state and so will eventually reduce S. Therefore, obtaining a proper doping level that will achieve a high $S^2\sigma$ is difficult.

The plots in FIG. 1, which are modified from those shown in G. J. Snyder et al., "Complex thermoelectric materials," Nature Materials 7, 105-114 (2008), illustrates this dilemma. As can be seen from FIG. 1, as carrier concentration increases, the Seebeck coefficient S decreases while the electrical conductivity $\sigma$ increases. $S^2\sigma$ also increases as carrier concentration increases, but only up to a certain level in carrier concentration, after which the decrease in S so outweighs the increase in conductivity $\sigma$ that the combined value of $S^2\sigma$ also decreases.

In addition, increasing electrical conductivity $\sigma$ in semiconductors will inevitably increase the thermal conductivity $\kappa$ because the charge carriers that conduct electricity also conduct heat in addition to phonons, and most known mechanisms that would reduce phonon transport will hinder charge carrier transport as well.

The scientific community has focused its efforts on finding ways to reduce $\kappa$ that have minimal effects on charge carrier transport. For example, one common way to reduce heat conduction is to introduce phonon scattering centers for phonons responsible for heat conduction.

The problem is that heat is carried by a broad band of phonons having wavelengths ranging from less than 1 nm to over 1000 nm. Since the phonon scattering centers have to be effective for the whole phonon bandwidth, the scattering centers that reduce thermal conductivity will almost inevitably also scatter charge carriers, thereby reducing electrical conductivity as well. The conventional approach to reduce phonon transport is to use grain boundaries to scatter phonons. Phonons are most effectively scattered by crystalline grains having the same size as the phonon wavelength, analogous to Rayleigh scattering of photons. In order for more substantial phonon scattering the entire phonon spectrum must be addressed with a matched distribution of grain sizes.

In the past two decades, there has been significant activity in thermoelectric research.

Approaches that have been used to reduce $\kappa$ have included use of PbSeTe-based quantum dot superlattice structures, see T. C. Harman et al., "Quantum Dot Superlattice Thermoelectric Materials and devices," Science 297, 2229 (2002); and embedding ErAs nanocrystallites in crystalline InGaAs thin films, see W. Kim et al. "Reducing Thermal Conductivity of Crystalline Solids at High Temperature Using Embedded Nanostructures," Nano Lett. 8, 2097 (2008).

Some of the other approaches used to reduce $\kappa$ include alloying (e.g. alloying Si with Ge to obtain $Si_{80}Ge_{20}$), use of heavy elements ($Bi_2Te_3$), and using materials having "rattling" modes in their crystal structures ($CoSb_3$). See, e.g., S. K. Bux et al., "Nanostructured Bulk Silicon as an Effective Thermoelectric Material," Adv. Funct. Mater. 2009, 19, 2445-2452; W. Liu et al., "Recent advances in thermoelectric nanocomposites," Nano Energy (2012) 1, 42-56; and D. J. Voneshen et al., "Suppression of thermal conductivity by rattling modes in thermoelectric sodium cobaltate," NATURE MATERIALS, Vol. 12 (November 2013), pp. 1028-1032.

Dependence of thermal conductivity on nanocrystalline size in BiTe-based thin film systems and bulk silicon germanium alloys has also been reported. See M. Takashiri et al., "Effect of grain size on thermoelectric properties of n-type nanocrystalline bismuth-telluride based thin films," J. Appl. Phys. 104, 084302 (2008) ("Takashiri 2008"). see also X. W. Wang et al., "Enhanced thermoelectric figure of merit in nanostructured n-type silicon germanium bulk alloy," Appl. Phys. Lett. 93, 193121 (2008); G. Joshi et al., "Enhanced Thermoelectric Figure-of-Merit in Nanostructured p-type Silicon Germanium Bulk Alloys," Nano Letters 2008, Vol. 8, No. 12, 4670-4674.

One newly explored approach has been to use nanostructured materials as thermoelectrics, motivated by early theoretical work which predicted the benefits of nanostructuring for increasing ZT. See, e.g., L. D. Hicks et al., "Effect of quantum-well structures on the thermoelectric figure of merit," *Phys. Rev. B* 47, 12727-12731, 1993; and L. D. Hicks et al., "Thermoelectric figure of merit of a one-dimensional conductor," *Phys. Rev. B* 47, 16631-16634 (1993).

Incorporation of nanostructures in addition to the legacy approaches described above has allowed for materials that reduce κ with minimal effect on G, resulting in drastic improvements in ZT. Recently, ZT of ball-milled nanocrystalline SiGe alloys has reached 1.84. See R. Basu et al., "Improved thermoelectric performance of hot pressed nanostructured n-type SiGe bulk alloys," *J. Mater. Chem. A*, 2014, 2, 6922-6930. In thin film systems, thermal conductivity has been reduced significantly by the use of interfaces in a $Bi_2Te_3/Sb_2Te_3$ superlattice, reaching a maximum of ZT=2.4. See R. Venkatasubramanian et al., "Thin-film thermoelectric devices with high room-temperature figures of merit," *Nature* 413, 597 (2001). In bulk material, a maximum ZT=2.2 has been achieved in a PbTe bulk material with nanoparticulates of SrTe and an extremely high Na (p-type) doping concentration. See K. Biswas et al., "High-performance bulk thermoelectrics with all-scale hierarchical architectures," *Nature* 489, 414-418 (2012).

These results demonstrate the power of nanostructures in reducing κ and decoupling electrical and thermal conductivities, but do not offer a route for practical manufacturing, and suitable nanostructured materials are often expensive and difficult to prepare.

Nanocrystalline thermoelectric materials have previously been made using a ball-milling process whereby doped crystalline silicon is ground together with a few atomic percent of germanium to produce nanometer-sized fine grains which are subsequently hot-compressed into bulk material. Recently, ball-milling has been used to successfully fabricate bulk thermoelectric materials having a ZT reaching 1.84. See Basu et al., supra; Joshi et al., supra, and Wang et al., supra; see also U.S. Pat. No. 7,255,846 to Ren et al., "Methods for synthesis of semiconductor nanocrystals and thermoelectric compositions"; U.S. Pat. No. 7,465,871 to Chen et al., "Nanocomposites with high foreign patent documents thermoelectric figures of merit"; U.S. Pat. No. 8,512,667 to Yang et al., "High Temperature Stable Nanocrystalline SiGe Thermoelectric Material"; and U.S. Patent Application Publication No. 2008/0202575 to Ren et al., "Methods for high figure-of-merit in nanostructured thermoelectric materials."

Ball-milling is less expensive than the more complicated techniques such as use of superlattices and quantum dots. However, the smallest grain size that ball-milling can obtain is about 10 nm, which is not small enough to scatter phonons having wavelengths smaller than that size, while at room temperature and above the majority of phonons have wavelengths smaller than 10 nm. To solve this problem, Ge is often added to the nanocrystalline structure to generate impurity scattering centers for short wavelength phonons.

Chemical vapor deposition (CVD) generates thin film nc-Si thermoelectric materials directly on a substrate as opposed to producing a nanopowder which must then be formed into a solid as does ball-milling. Thin film CVD-based deposition techniques have not been widely used to fabricate thermoelectric materials, although some preliminary research in this direction has been reported, see M. Takashiri et al., "Transport properties of polycrystalline $Si_{0.8}Ge_{0.2}$ thin films for micro power generators," *Proceedings ICT'03. 22nd International Conference on Thermoelectrics* (IEEE Cat. No. 03TH8726), Pages: 395-8 (2003) ("Takashiri 2003"), and recently, CVD techniques have been used to harvest nanocrystalline SiGe powder which is then compressed to make bulk thermoelectric material. See Takashiri 2003, supra; see also T. Claudio et al. "Nanocrystalline silicon: lattice dynamics and enhanced thermoelectric properties," *Phys. Chem. Chem. Phys.* 2014, 16, 25701-25709. However, the nanocrystalline silicon produced by the Takashiri group had grain sizes of at least 20 nm, while the nanocrystalline silicon produced by the Claudio group had even larger grain sizes over 30 nm. The large grain size of these previous CVD-prepared materials limits the improvement of ZT and makes the technique not as competitive as the ball-milling technique.

In addition, these prior art films all require the use of a silicon-germanium alloy, where Ge is used to scatter short-wavelength phonons and thereby reduce the thermal conductivity of the material. See, e.g., M. Takashiri et al., "Structure and thermoelectric properties of boron doped nanocrystalline $Si_{0.8}Ge_{0.2}$ thin film," *J. Appl. Phys.* 100, 054315 (2006) ("Takashiri 2006").

However, mixing Ge with Si has a number of problems. Ge is expensive, 1000 times more expensive than Si, making the use of such SiGe alloys impractical in many cases. Ge has a higher electron affinity than does Si, so that the addition of Ge impedes the transport of electrons through the material, reducing its electrical conductivity. Finally, Ge has a lower melting point than does Si, limiting the temperature range at which a SiGe alloy can be used.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

As described in more detail below, a doped nc-Si thin film thermoelectric material in accordance with the present invention can be formed by a three-step process in which a nc-Si thin film is slowly deposited on a substrate, either by hot-wire CVD (HWCVD) with a controlled $H_2:SiH_4$ ratio R=6-10 or by plasma-enhanced CVD (PECVD) with a controlled $H_2:SiH_4$ ratio R=80-100, followed by ion implantation of an n- or p-type dopant and a final annealing step to activate the implanted dopants and to remove amorphous regions.

A doped nc-Si thin film thermoelectric material formed by the three-step method in accordance with the present invention has both a controllable grain size of from a few tens of nm to 3 nm and a controllable dopant distribution and thus can be configured to provide a thermoelectric material having predetermined desired thermal and/or electrical properties.

BRIEF DESCRIPTION OF THE DRAWINGS

FIGS. 9A-9D are plots illustrating the temperature dependence of thermoelectric power S, electrical conductivity $\sigma$, thermal conductivity $\kappa$, and thermoelectric figure of merit ZT, respectively, of prior art bulk Si and an exemplary nc-Si thin film thermoelectric material formed in accordance with the present invention.

DETAILED DESCRIPTION

Figure 1:
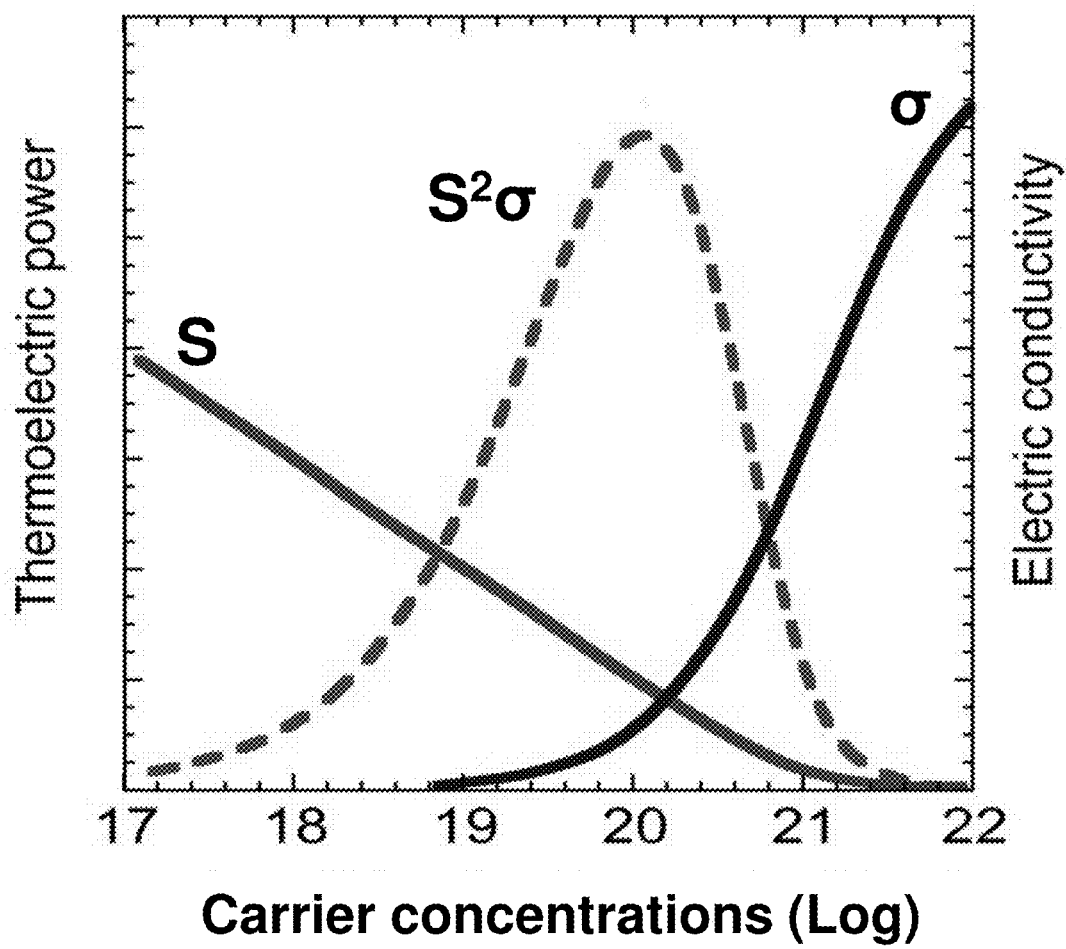
FIG. 1 is a plot illustrating the relationship among carrier concentration, thermoelectric power, and electrical conductivity relevant to aspects of the present disclosure.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides methods for forming a doped nanocrystalline silicon (nc-Si) thin film thermoelectric material that is free from any added germanium and has both a high electrical conductivity $\sigma$ and a low thermal conductivity $\kappa$ and thus has a high ZT.

As described in more detail below, a doped nc-Si thin film thermoelectric material in accordance with the present invention can be formed by a three-step process in which a nc-Si thin film is deposited on a substrate by very slow CVD, either plasma-enhanced (PECVD) or hot-wire CVD, (HW-CVD) followed by ion implantation of an n- or p-type dopant and a final annealing step to activate dopants and to remove amorphous regions. A doped nc-Si thin film thermoelectric material formed by the three-step method in accordance with the present invention has both a controllable grain size of from a few tens of nm to 3 nm and a controllable dopant distribution and thus can be configured to provide a thermoelectric material having predetermined desired thermal and/or electrical properties.

The method of the present invention and the doped nc-Si thin film thermoelectric material produced in accordance with such method are described below.

The method in which the nc-Si is deposited in accordance with the present invention utilizes two key new features.

In undoped nc-Si, CVD of pure $SiH_4$ produces amorphous silicon (a-Si) thin films, and so hydrogen is added to the $SiH_4$ deposition mixture in order to generate nanocrystallites in the resulting thin films. For films produced with a high R and a proper combination of deposition chamber pressure, gas flow rate, and plasma power, nanocrystallites with very small grain sizes dominate. Although a substrate temperature of about 250° C. produces the best results in this work, it is possible to vary substrate temperature with other deposition parameters to produce similar results, and all embodiments employing other substrate temperatures are deemed to be within the scope of the present invention. The initial high crystalline content and small grain size is important because the final annealing will convert remaining amorphous regions into crystalline ones by increasing the grain sizes.

For plasma-enhanced CVD the $H_2$ to $SiH_4$ ratio R has to be greater than 36 to grow mostly nanocrystalline thin films, while for hot-wire CVD, R must be greater than 3. See G. Yue et al., "Structure and Optoelectronic Properties as a Function of Hydrogen Dilution of Micro-Crystalline Silicon Films Prepared by Hot Wire Chemical Vapor Deposition," *Mater. Res. Soc. Symp. Proc.* 557, 525-530 (1999); and D. L. Williamson, "Medium-Range Order in a-Si:H Below and Above the Onset of Microcrystallinity," *Mater. Res. Soc. Symp. Proc.* 557, 251-256 (1999).

Thus, the first key new feature relates to the ratio of $H_2$ to $SiH_4$ in the CVD deposition mixture. In the method of forming a doped nc-Si thin film thermoelectric material in accordance with the present invention, the ratio R of $H_2$ to $SiH_4$ in the CVD deposition mixture is controllably increased from the R=30-40 levels used in the prior art to R=80-100, in the case of plasma-enhanced CVD, or R=6-10, in the case of hot-wire CVD. In neither case is germanium added to the mixture, so that the resulting thin film is nanocrystalline silicon, not nanocrystalline SiGe as in the prior art.

In general, the nanocrystalline silicon content of the deposited film increases with increasing R for both types of thin films. This is illustrated by the plots shown in FIG. 2, which show the nanocrystalline content of thin films produced by the inventors at the National Renewable Energy Laboratory (NREL) and at the Naval Research Laboratory (NRL). As can be clearly seen from FIG. 2, in the case of HWCVD films, increasing R from just over 0 to just over 10 produces an increase in crystallinity in the resulting material from about 35% to over 90%, as shown by the star-shaped indicators in the FIGURE. While not as dramatic, as shown by the circle-shaped indicators in the FIGURE, the results obtained at NRL for PECVD films also show an increase in crystallinity as R increases from just over 20 (crystallinity of about 80%) to R=50 (crystallinity of about 85%) to R=100 (crystallinity of about 90%). The crystalline content in the plasma-enhanced CVD films deposited at NRL and NREL are within 10%. In addition, as can be seen from the square-shaped indicators in the FIGURE, a doped film, in this case a film doped with $B_2H_6$ during deposition, has greater amorphous content than a similar, but undoped, film; this shows why doping during deposition is not a good option.

The second key feature of the deposition method in accordance with the present invention is the slow rate of deposition of the silicon in the CVD process. In the methods of the prior art, nc-Si thin films have been grown at high deposition rates. See, e.g., M. Kondo et al., "High rate growth of microcrystalline silicon at low Temperatures," *Journal of Non-Crystalline Solids* 266-269 (2000) 84-89; and Y. Mai et. al., "Microcrystalline silicon solar cells deposited at high rates", *J. Appl. Phys.*, 97, 114913 (2005).

In contrast, the PECVD nc-Si thin films in accordance with the present invention are deposited at a rate of about 0.01-0.03 nm/s. This slow deposition rate is a result of the high $H_2$:$SiH_4$ ratio, which as noted above, has not been used before in the production of thermoelectric materials. In this work, we use high $H_2$ flow rate from 100 sccm to 300 sccm and adjust the $SiH_4$ flow rate to obtain the desired R ratio. The plasma power is tuned from 90 to 300 W with a frequency of 13.56 MHz, and the chamber pressure from 500 to 2000 mTorr. In general, decreasing $SiH_4$ flow rate, plasma power, and chamber pressure in the deposition mixture decreases the rate of CVD deposition. Fine adjustments have to be made to avoid large amorphous regions in one hand, and large crystallite sizes in the other. The exact conditions could differ in different deposition systems.

In an exemplary embodiment, an nc-Si thin film is deposited by a PECVD process having the following parameters: $H_2$:$SiH_4$ ratio R=100, plasma power 90 W with a frequency of 13.56 Mhz, chamber pressure 700 mTorr, and substrate temperature 250° C. The resulting film grows at a rate of 0.02nm/s.

The PECVD method of the present invention produces a nc-Si thin film having grain sizes on the order of 3-5 nm, much smaller than any of those in the prior art. nc-Si films having such a small grain size will efficiently scatter most phonons at room temperature, without the need for any added germanium as in the nc-SiGe films or bulk materials according to the prior art. As described in more detail below, the nc-Si thin film thermoelectric materials produced in accordance with the present invention exhibit a very low thermal conductivity, even lower than the theoretical limit exhibited by amorphous silicon.

The smallest grain size of HWCVD nc-Si thin film obtained by the inventors is about 10 nm, which, while not as good as PECVD, is good enough to rival the grain size obtained by prior art ball-milling techniques. However, an advantage of hot-wire CVD versus PECVD is that it can deposit at a higher rate, which saves time. In an exemplary embodiment of hot-wire CVD of a nc-Si thin film thermoelectric material in accordance with the present invention, the nc-Si film is deposited on a substrate having a temperature of about 250° C. by means of a tungsten filament having a temperature of about 2000° C. in a deposition chamber having a chamber pressure of about 25 mTorr. The $SiH_4$ flow rate was maintained at 8 sccm while the $H_2$ flow rate varied for desired dilution. The background pressure of the deposition chamber is in the low $10^{-7}$ Torr. Using such parameters, a deposition flow rate of about 1 nm/s is obtained.

Figures 3A, 3B, 3C:
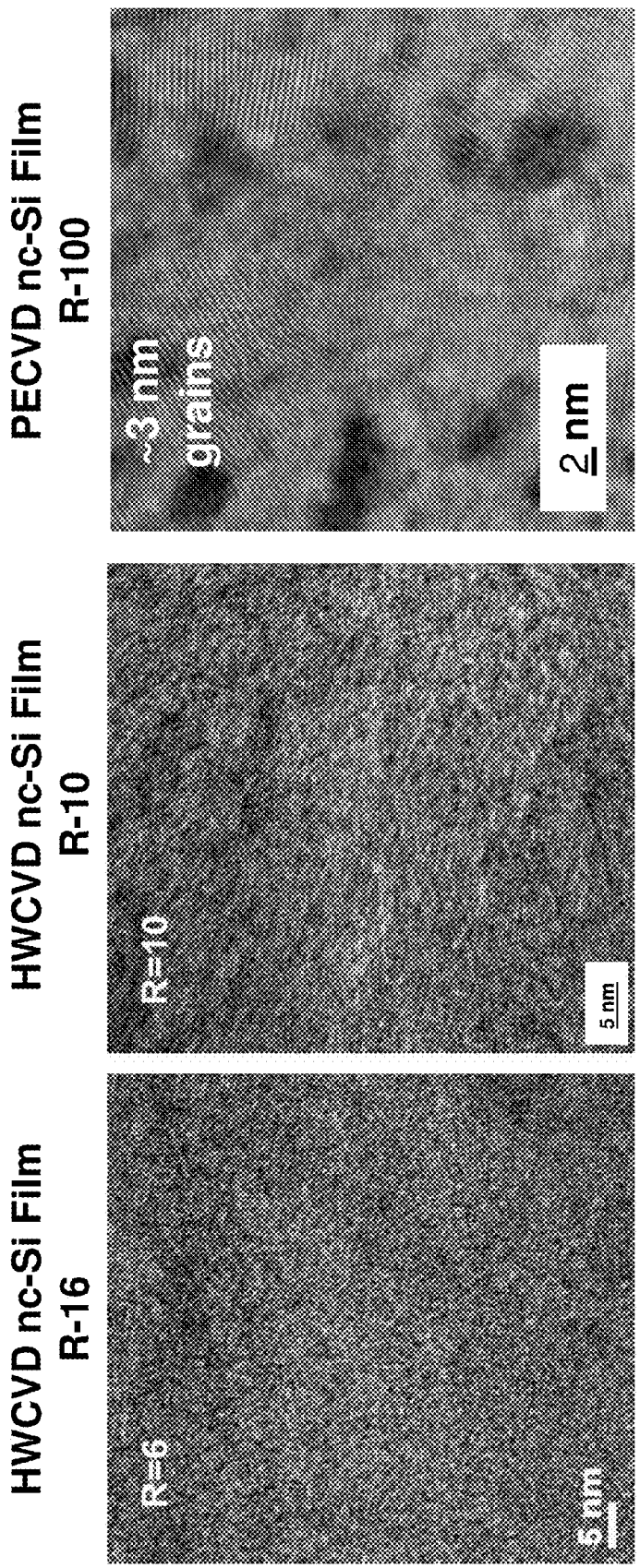
FIGS. 3A-3C are high-resolution cross-section TEM images and electron diffraction patterns for exemplary nc-Si thin film thermoelectric materials formed by hot-wire CVD and plasma-enhanced CVD in accordance with the present invention.

The advantageous results produced by the increased R and reduced CVD deposition rate in accordance with the present invention are confirmed by the cross-section transmission electron microscopy (TEM) images shown in FIGS. 3A-3C.

FIGS. 3A and 3B, respectively, show the results of TEM measurements performed on hot-wire CVD films with R=6 and R=10 For example, as can be seen from the TEM images in FIG. 3A, increasing the ratio R of $H_2$ in the $H_2$:$SiH_4$ deposition mixture to 6 in accordance with the present invention produces a nc-Si thin film having grain sizes smaller than 10 nm. Similar results are produced by increasing R to 10, as can be seen in the TEM images in FIG. 3B.

Similar results are obtained by plasma-enhanced CVD nc-Si films produced in accordance with the method of the present invention. In the case of PECVD films, increasing the ratio of $H_2$ in the $H_2$:$SiH_4$ deposition mixture to about 100 and reducing the rate of CVD deposition to about 0.02 nm/s produces a nc-Si thin film having grain sizes of about 3 nm; this is illustrated by the TEM shown in FIG. 3C, which depicts an exemplary PECVD nc-Si thin film produced according to the method of the present invention.

Thus, the first step in a method for making a doped nc-Si thin film thermoelectric material in accordance with the present invention produces a germanium-free silicon film with grain sizes much smaller than any previously produced.

Figure 4:
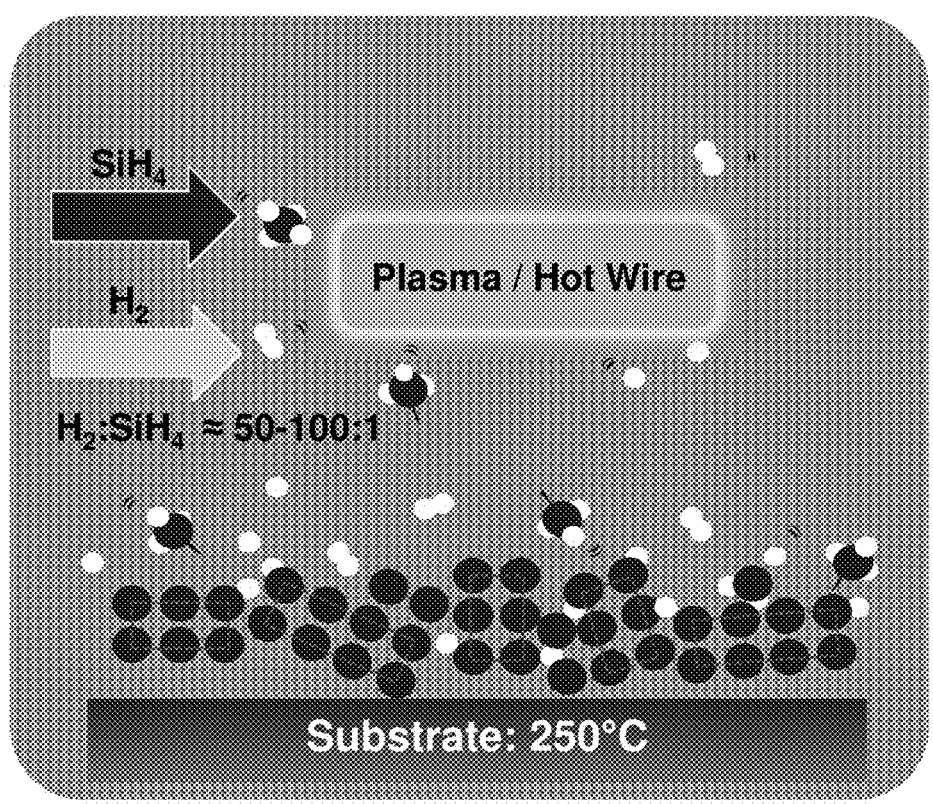
FIG. 4 is a block diagram illustrating aspects of hot-wire and plasma-enhanced CVD nc-Si thin film thermoelectric materials formed in accordance with the present invention.

In addition, as illustrated in the block schematic shown in FIG. 4 as well as in the TEM in FIG. 3C, the nanocrystalline Si grains in the thin film produced by either plasma-enhanced or hot-wire CVD have a random orientation with respect both to the substrate and to each other. The random orientation of these grains—and of their grain boundaries— impedes the transport of phonons through the material, giving the material a small thermal conductivity κ.

Figures 5A, 5B:
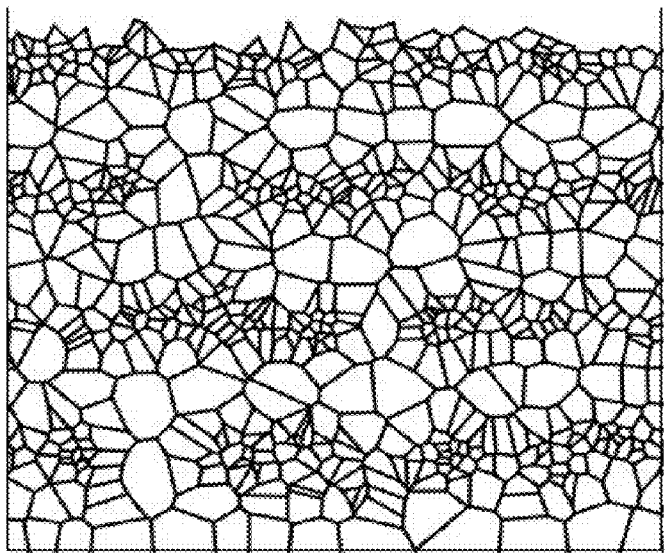
FIGS. 5A and 5B illustrate aspects of a multilayered nc-Si thin film thermoelectric materials formed in accordance with the present invention.

Moreover, by controllably varying the $H_2$ content of the deposition mixture with each deposition cycle, an engineered layered thin film having a desired controlled distribution of grain sizes can be obtained, producing a material with even lower thermal conductivity κ, where the thermal conductivity κ value can be controlled to obtain a desired value. FIG. 5 is a block diagram of such an engineered layered film, and illustrates the engineered distribution of grain sizes at each layer that can be achieved using the method of the present invention. This can be further seen in the TEM image shown in FIG. 5B, which shows an actual multi-layered nc-Si thin film engineered in accordance with this aspect of the present invention.

Thus, the first of the three steps of a method for producing an nc-Si thin film thermoelectric material in accordance with the present invention produces a germanium-free nc-Si thin film, where the film can be engineered to provide a desired level of thermal conductivity, even reaching a record low measured thermal conductivity in silicon The second step of a method for producing an nc-Si thin film thermoelectric material having a high ZT in accordance with the present invention is designed to increase the electrical conductivity and thermoelectric power of the material.

As is well known in the art, the introduction of dopants into a material can increase its n-type or p-type conductivity. Conventional methods of producing a doped nc-Si film use ball-milling of bulk silicon and a dopant material to produce a doped nanocrystalline powder which is then hot-pressed into a TE material. See Wang et al., supra, and Joshi et al., supra. However, the distribution of dopants in this process could cause segregation of dopants, see Joshi et al., and can produce an uneven level of doping in the final material. Some prior art CVD methods dope the $H_2$:$SiH_4$ deposition mixture, with, e.g., $B(CH_3)_3$ or $B_2H_6$ before deposition of the film, see P. Alpuim et al, "Electronic and structural properties of doped amorphous and nanocrystalline silicon deposited at low substrate temperatures by radio-frequency plasma-enhanced chemical vapor deposition," *Journal of Vacuum Science & Technology A* 21, 1048-1054 (2003), but it is not possible to add enough of such dopants to provide improved electrical performance without completely amorphizing the thin films, which makes them unusable for thermoelectric applications.

The method of the present invention overcomes these deficiencies of the prior art. In the second step of the method for producing a nc-Si thin film thermoelectric material in accordance with the present invention, dopant ions are implanted into the nc-Si material that was produced using the CVD deposition process described above, where the distribution of dopant ions can be controlled to obtain a desired dopant distribution in the material. For example, by using a suitable software such as the free SRIM software available at www.srim.org to compute the implantation ion energy and doses, the dopant ions can be evenly distributed throughout the depth of the thin films. Any suitable n-type or p-type dopant can be used, with phosphorus being an exemplary n-type and boron being an exemplary p-type dopant that can be used. The film is doped to a very high concentration of about $10^{21}$ cm$^{-3}$ (compared to a silicon density in nc-Si of about $5 \times 10^{22}$ cm$^3$). By doping to such a high concentration, the electrical conductivity σ of the nc-Si film in accordance with the present invention can be greatly increased. In addition, using ion-implantation of the dopants after formation of the nc-Si film permits the creation of a controlled dopant profile (n-type or p-type)—and thus a controlled electrical conductivity profile—within selected areas of the material without the need for separate n-type or p-type materials which must be assembled together. This is an advantage over other techniques, including the ball-milling.

Following the implantation of dopant ions, in a third step of a method for forming a doped nc-Si thin film thermoelectric material in accordance with the present invention, the thin film is annealed to activate the dopants by thermally driving the interstitial dopant atoms into substitutional sites and to remove any possible amorphous region formed during deposition. It is preferred that this annealing take place in two stages, i.e., a furnace anneal followed by multicycle rapid thermal annealing, since it has been found that rapid thermal annealing makes the material more electrically conductive than regular furnace annealing alone. See Takashiri 2006, supra.

Thus, in an exemplary embodiment, in a third step of a method for forming a doped nc-Si thin film thermoelectric material in accordance with the present invention, the dopant-implanted nc-Si thin film is subjected to a furnace anneal at 700° C. for about 5 hours followed by rapid thermal annealing at 800° C. for about 1 minute to improve the electrical conductivity of the material. In other embodiments, the furnace annealing can be done at temperatures of about 600-800° C. for at least about two hours, followed by rapid thermal annealing at temperatures of 800 to 1000° C. for at least about one minute.

In the case of a multi-layered nc-Si thin film thermoelectric material, in some embodiments, e.g., a multi-layered film having a thickness of about 500 nm, the multi-layered film can be ion-implanted with dopants and then annealed after all layers have been deposited. In cases in which a thicker film is required, the process of deposition and ion implantation can be repeated a few times until a desired thickness of doped film has been reached, and then the doped film can be annealed. In general, the thicker the film, the higher the ion implantation energy is needed to drive the ions into the required depth.

Thus, in the method of the present invention, a germanium-free doped nc-Si thin film thermoelectric material can be prepared by means of a three-step process in which a substantially nanocrystalline Si thin film having grain sizes on the order of tens of nanometers to about 3 nanometers is deposited on a substrate by means of hot-wire or plasma-enhanced CVD, the nc-Si thin film is doped by means of ion implantation, and the doped nc-Si thin film is annealed in a two-stage annealing process. A doped nc-Si thin film thermoelectric material prepared using the method of the present invention has a high electrical conductivity G, high thermoelectric power S, a low thermal conductivity K, and a high thermoelectric figure of merit ZT.

To demonstrate the performance of the nc-Si thin film thermoelectric materials in accordance with the present invention, films were prepared by the inventors at both NREL and NRL. These films were examined and their properties and advantages are illustrated by the plots in FIGS. 3 and 5 discussed above and FIGS. 6, 7, 8, and 9A-9D discussed below.

Figure 6:
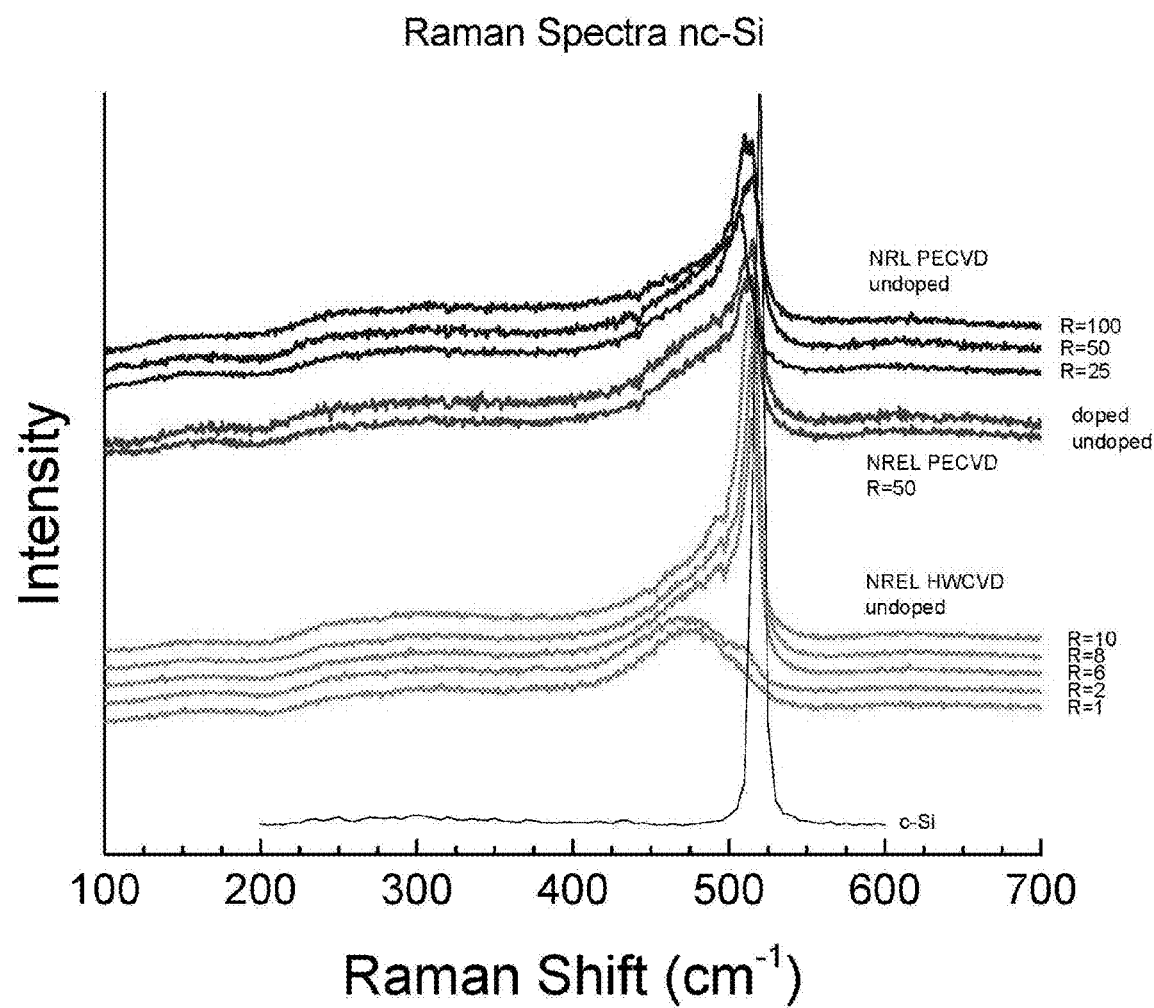
FIG. 6 is a plot illustrating the Raman scattering spectra of various exemplary as-deposited hot-wire and plasma-enhanced CVD nc-Si thin film thermoelectric materials formed in accordance with the present invention. The crystal fraction shown in FIG. 2 is calculated from the Raman spectra shown here.

The plots in FIG. 6 show Raman spectra of most amorphous Si ("a-Si") and nc-Si thin films used in this work and demonstrate the amorphous or crystalline nature of films prepared by CVD at different $H_2$:$SiH_4$ ratios R. The Raman intensity is separated for each group of thin films, and offset vertically for each film for clarity. The areas underneath the peaks are used to compute the amorphous and crystalline content in each thin films. As R increases, the amorphous peak at 480 cm$^{-1}$ decreases while the crystalline peak at 520 cm$^{-1}$ increases.

For the five hot-wire CVD thin films prepared by NREL, the films were deposited by a filament having a temperature of 2000° C. on a substrate having a temperature of 250° C. under a gas pressure of 25 mT and a background pressure of the deposition chamber in the low $10^{-7}$ Ton. The $SiH_4$ flow rate was maintained at 8 sccm while the $H_2$ flow rate varied for desired dilution of R=1 to R=10, crossing the known amorphous to nanocrystalline transition at R=3. See Yue et al., supra. The Raman spectra of the NREL HWCVD films (curves in the lower part of FIG. 6) show the characteristic peak for the amorphous thin films (R=1 and R=2) at 480 cm$^{-1}$. For the three films on the nanocrystalline side (R=6, R=8, and R=10), the Raman spectra show distinct crystalline peak at 520 cm$^{-1}$, while the broad shoulder at the left side represents some large proportion of grain boundary content in the material.

Two plasma-enhanced CVD thin films were prepared by NREL, one being an undoped film and the other being doped with phosphine ($PH_3$). An $H_2$:$SiH_4$ ratio of R=50 was used for both the doped and undoped films, which is higher than the known ratio of R=36 that produces an amorphous to nanocrystalline transition, see Williamson, supra, with the $H_2$:$SiH_4$:$PH_3$ ratio for the phosphine-doped film being 50:1:0.2. The films were deposited on a substrate having a temperature of 250° C. using an RF (13.56MHz) power of 20 W. As can be seen from the plots in FIG. 6, the Raman spectra for these films (curves in the middle part of FIG. 6) show the characteristic peak for the crystalline silicon at 520 cm$^{-1}$ with a broad shoulder at lower frequency side.

The three undoped plasma-enhanced CVD thin films prepared by NRL (curves in the upper part of FIG. 6), were prepared using $H_2$:$SiH_4$ ratios of R=25, R=50, and R=100, a substrate temperature of 250° C., RF (13.56 MHz) power of 80 W, and a chamber pressure maintained at 700 mTorr. The shift of the peak from 480 cm$^{-1}$ to 520 cm$^{-1}$ as R increases can be easily seen, showing that For R=25, the film is mostly amorphous, while for R=50 and R=100, the films are mostly nanocrystalline.

Thus, the Raman spectra in FIG. 6 confirm that crystalline films can be obtained by CVD using the high $H_2$:$SiH_4$ ratios of the present invention.

Figure 7:
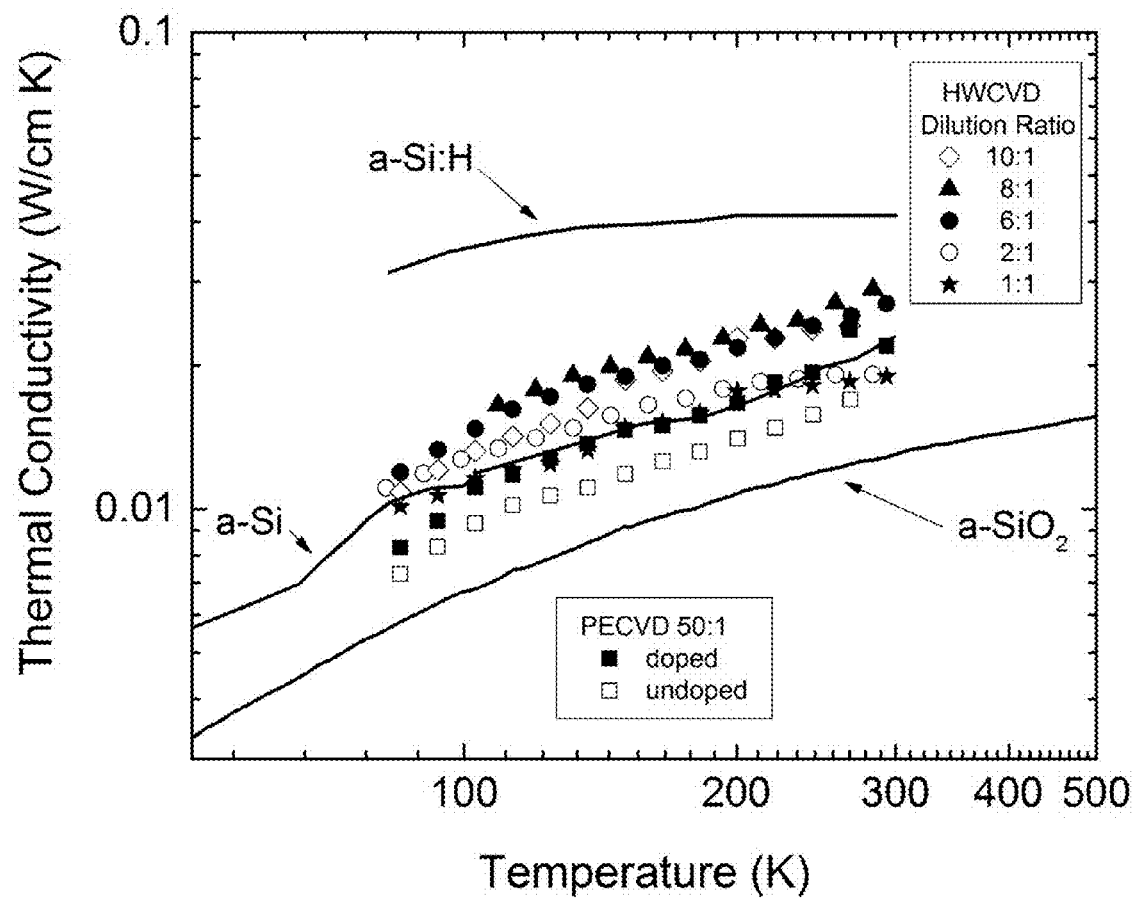
FIG. 7 is a plot illustrating the temperature-dependent thermal conductivity of hot-wire and plasma-enhanced CVD nc-Si thin film thermoelectric materials formed in accordance with the present invention.

The temperature-dependent thermal conductivity results of nc Si films prepared in accordance with the present invention are shown by the plots in FIG. 7. The grain sizes of these films, deposited either by plasma enhanced or hot wire CVD are all around 10 nm. The thermal conductivity values of all these films are clustered in a narrow range around 0.01 W/cmK, which is about two orders of magnitude smaller than that of single crystalline silicon, similar to that of electron beam evaporated a-Si, see B. L. Zink et al., "Thermal Conductivity and Specific Heat of Thin Film Amorphous Silicon," *Phys. Rev. Lett.* 96, 055902 (2006), and smaller than that of a high thermal conductivity a-Si prepared by hot wire CVD, see X. Liu et al., supra.

Figure 2:
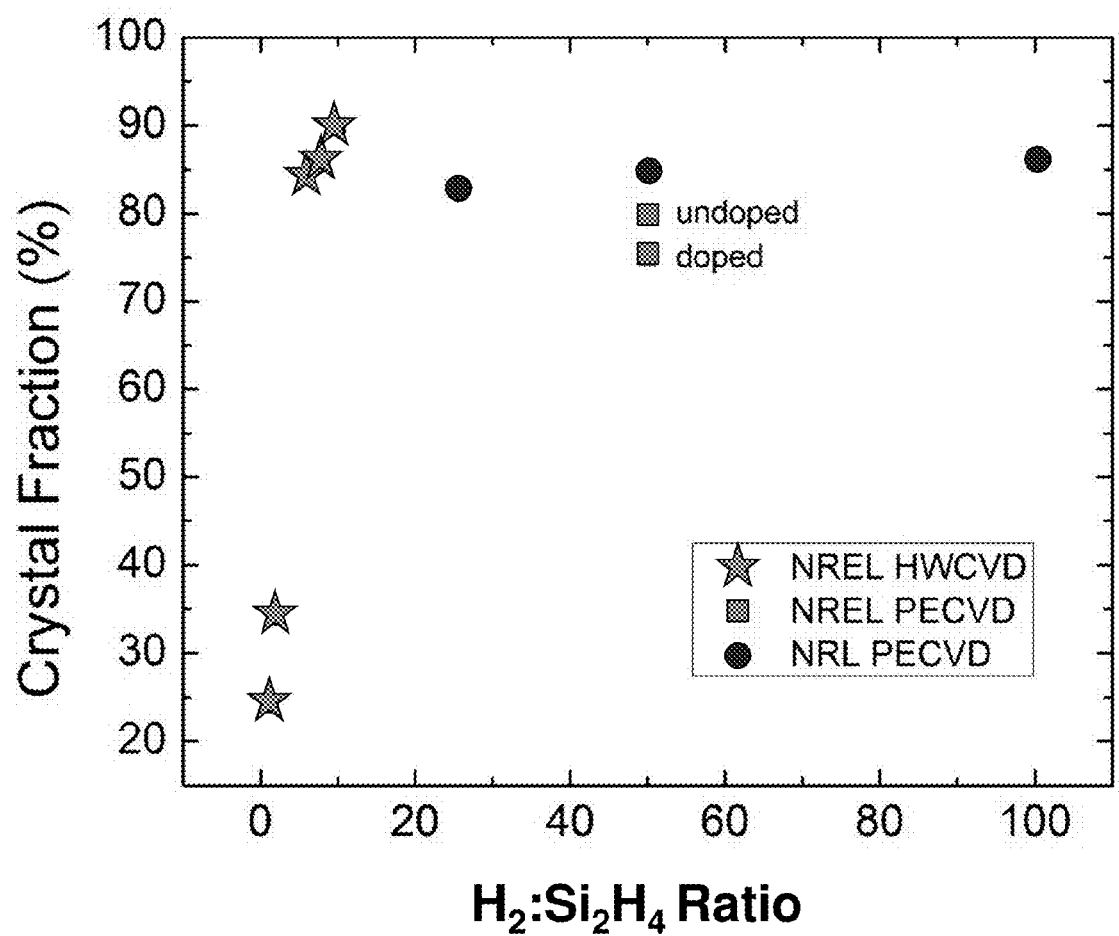
FIG. 2 is a plot illustrating the crystal fraction of both as-deposited hot-wire and plasma-enhanced CVD Si as a function of the ratio of $H_2$ to $SiH_4$ during deposition.

As can be seen from the plots in FIG. 7, while thermal conductivity for the nc-Si thin films prepared using hot wire CVD in accordance with the method of the present invention increases with increasing R, it remains about the same as that of a-Si, the theoretical minimum. In addition, as can also be seen from the plots in FIG. 7, in the case of plasma enhanced CVD films prepared in accordance with the present invention with R=50, while doping to increase the film's electrical conductivity increases the film's thermal conductivity slightly, the thermal conductivity remains comparable to that of a-Si. Thus, the plots in FIG. 7 demonstrate that the films prepared in accordance with the present invention can achieve both goals of having a high electrical conductivity and a low thermal conductivity. However, as shown in FIG. 2, because doping during deposition will reduce the crystalline content of the thin film material, the method of the present invention uses ion implantation to dope the material instead.

Figure 8:
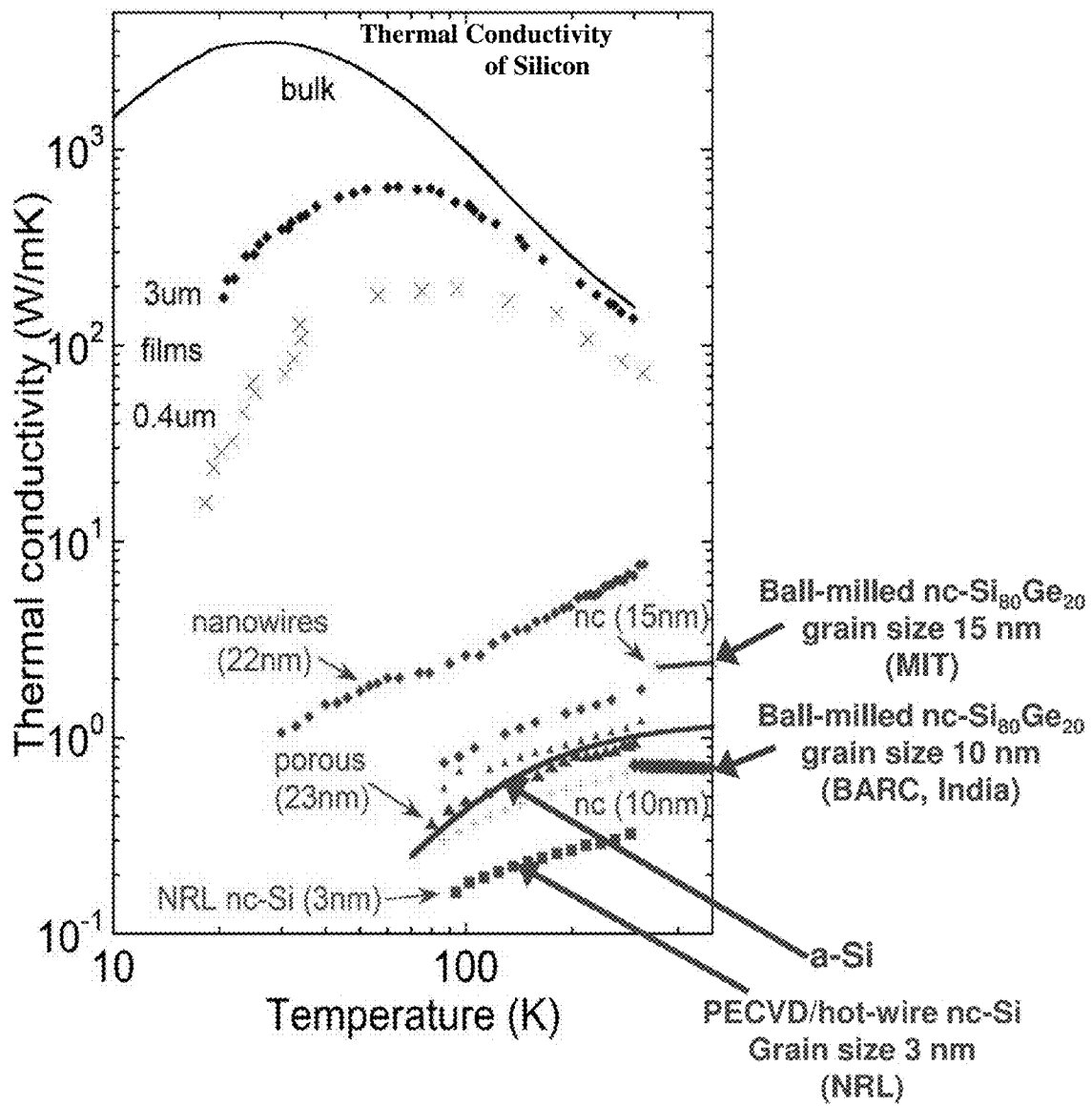
FIG. 8 contains plots illustrating the thermal conductivity of prior art ball-milled nanocrystalline Si alloys and the plasma-enhanced CVD nc-Si thin film thermoelectric materials formed in accordance with the present invention.

The plots in FIG. 8 compare the thermal conductivity of exemplary nc-Si thin films prepared by plasma-enhanced and hot-wire CVD with varying nanocrystallite sizes in accordance with the present invention (labeled as "NRL" in the FIGURE) against the performance of SiGe films prepared by the Massachusetts Institute of Technology, as reported in Wang et al., supra and Joshi et al., supra (collectively labeled as "MIT" in the FIGURE); and the performance of SiGe films prepared by the Bhabha Atomic Research Center, as reported in Ranita Basu, supra (labeled as "BARC, India" in the FIGURE).

As can be seen in FIG. 8, the NRL nc-Si films prepared in accordance with the present invention in the have grain sizes of 3 nm, much smaller than the 10 nm grains of the BARC films or the 15 nm grains obtained by MIT.

The solid line in FIG. 8 indicates the theoretical thermal conductivity of amorphous silicon, which was believed to be the lowest thermal conductivity limit of a given material one can get by phonon scattering alone. To get lower thermal conductivity, phonon speed of sound or phonon population has to be reduced by nanostructuring.

The plots in FIG. 8 demonstrate how the thermal conductivity of crystalline silicon reduces as the sample dimension reduces from bulk, to thin films, and to nanowires, with the MIT material with its grain size of 15 nm having a higher thermal conductivity than the BARC material with its grain size of 10 nm and the NRL material, with its grain size of 3 nm, having the lowest thermal conductivity of the three, below the theoretical limit of thermal conductivity at all temperatures. Indeed, the capability of the current technique to reduce the grain sizes to an unprecedented 3 nm level and to reach a record-breaking low thermal conductivity makes it a very promising material for thermoelectric applications.

The plots in FIGS. 9A-9D further illustrate the advantageous results obtained by nc-Si films prepared in accordance with the present invention. From FIG. 9A to 9D, the thermoelectric power, electric conductivity, thermal conductivity, and thermoelectric figure of merit ZT are compared to the BARC and MIT prior art materials described above, as well as commercial polycrystalline SiGe material used, e.g., in radio-isotope thermoelectric generators (labeled as "RTG" in the FIGURE; see Joshi et al., supra.).

As can be seen in FIG. 9A, the NRL films obtain a higher Seebeck coefficient S than either the RTC or MIT films at low temperatures below 400 K, and obtain a value of S comparable to that obtained by the BARC films.

FIG. 9B shows a comparison of the electrical conductivity of the four films. As described above, reducing the grain size to reduce thermal conductivity also has the trade-off effect of reducing electrical conductivity, and so, as can be seen from the plots in FIG. 9B, the NRL films have an electrical conductivity $\sigma$ ($10^4$ S/m) that is lower than that of the other three films. However, we the inventors believe that the electrical conductivity of our films can be improved by further optimization of ion implantation doses.

FIG. 9C shows the results of thermal conductivity measurements of the NRL film as compared to the three prior art films. As noted above, smaller grain sizes in a material scatter phonons more effectively, reducing the material's thermal conductivity. As can be easily seen from FIG. 9C, the NRL films, which have the smallest grain sizes of the films examined, has a thermal conductivity $\kappa$ that is much lower than that of the other three films.

Finally, FIG. 9D shows the comparison of the thermoelectric figure of merit ZT. As can be easily seen from the plots in FIG. 9D, in the temperature range of our measurements, currently up to 300K, our results compare favorably against all of the other SiGe materials.

Advantages and New Features

In comparison with ball-milling technique, the CVD technique has at least the following advantages:

The minimum grain size that ball milling technique can reach is about 10 nm, which is not small enough to significantly reduce short wavelength phonon scattering. At above room temperature, the dominant phonons that contribute to thermal conduction have a wavelength about 1 nm and less. To overcome this problem, up to 20% germanium is mixed with silicon to create point defects in the material in order to scatter those short wavelength phonons and to reduce thermal conductivity. Germanium is one thousand times more expensive than silicon resulting in two hundred times the material cost as compared to a silicon only device. Additionally, germanium also compromises the electronic conduction properties of the material and reduces the useful temperature range of the device due to low melting point of the SiGe alloys (about 150° C. lower). The nc-Si thin films of the present invention can reach grain sizes of about 3 nm, and therefore do not require the addition of germanium to reduce the scattering of short wavelength phonons.

Ball milling tends to have a narrow distribution of grain sizes. The best ball milling technique can achieve is a homogenous distribution of different sizes of grains. For CVD technique, the grain sizes and their distributions can be controlled in a wide range and layers of larger and smaller grain sizes can be realized by controlling deposition condition, e.g. hydrogen dilution ratio and deposition temperature.

The CVD fabrication process is compatible to general silicon-based large area integrated circuit manufacturing process. The CVD based thin film thermoelectric material can be used in a large variety of on-chip applications, either generating electricity to power devices or providing cooling in temperature sensitive applications.

In comparison with other thin film thermoelectric approaches, nc-Si can be prepared inexpensively in large scale. It is nontoxic and comparable with many on-chip processing.

The present invention provides methods for forming a doped nanocrystalline silicon (nc-Si) thin film thermoelectric material that is free from any added germanium and has both a high electrical conductivity σ and a low thermal conductivity κ and thus has a high ZT.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein. The present application contemplates any and all modifications within the spirit and scope of the underlying invention described and claimed herein, and all such embodiments are within the scope and spirit of the present disclosure.

What is claimed is:

1. A process for forming a germanium-free doped nanocrystalline silicon (nc-Si) thermoelectric material having a high electrical conductivity and a low thermal conductivity, comprising the steps of:
   (1) providing a deposition mixture comprising $H_2$ and $SiH_4$ having a controlled $H_2:SiH_4$ ratio R of between 6 and 10, the deposition mixture being free of any added germanium;
   (2) controllably depositing the deposition mixture on a substrate by means of hot-wire chemical vapor deposition (HWCVD) at a growth rate of about 1-5 nm/s to form an nc-Si thin film material having a controlled grain size of about 15 nm to about 9 nm and a predetermined thermal conductivity κ, wherein the grain size is controlled by controlling the $H_2:SiH_4$ ratio R of the deposition mixture;
   (3) controllably doping the nc-Si thin film material by implanting dopant ions into the material to a concentration of about $10^{21}$ cm$^{-3}$ to form a doped nc-Si thin film material having a controlled dopant profile and controlled electrical conductivity; and
   (4) annealing the doped nc-Si thin film material by first subjecting the material to a furnace annealing at a temperature between about 600 and about 800° C. for at least about 2 hours and then subjecting the material to a cycle of rapid thermal annealing at a temperature of about 800 to about 1000° C. for at least 1 minute.

2. The process according to claim 1, wherein the nc-Si thin film is doped with an n-type dopant.

3. The process according to claim 1, wherein the nc-Si thin film is doped with a p-type dopant.

4. The process according to claim 1,
   wherein the nc-Si thin film is deposited on a substrate having a temperature of 250° C. by means of a tungsten filament having a temperature of about 2000° C.;
   wherein a chamber pressure of the deposition chamber is 25 mTorr and a background pressure of the deposition chamber is in the low $10^{-7}$ Torr;
   wherein a flow rate of the $SiH_4$ in the deposition mixture is 8 sccm; and
   wherein the nc-Si film has a growth rate of about 1 nm/s.

5. The process according to claim 1, further comprising depositing multiple layers of nc-Si on the substrate to produce an engineered multi-layered nc-Si thin film thermoelectric material having a predetermined overall thermal conductivity κ, wherein each layer is deposited using a deposition mixture of $H_2$ and $SiH_4$ having a controlled R to produce a layer of nc-Si having a predetermined grain size, wherein the grain sizes of the layers of the nc-Si thin film are configured to obtain the predetermined overall thermal conductivity κ.

6. The process according to claim 5, wherein the nc-Si thin film material is doped and annealed after all layers have been deposited.

7. The process according to claim 5, wherein the nc-Si thin film material is doped and annealed after deposition of less than all of the layers have been deposited, the deposition, doping, and annealing steps being repeated until all layers have been deposited, doped, and annealed.

* * * * *